United States Patent
Olsak et al.

(10) Patent No.: US 11,251,789 B1
(45) Date of Patent: Feb. 15, 2022

(54) INSTABILITY MANAGEMENT IN A SIGNAL DRIVER CIRCUIT

(71) Applicant: SEMICONDUCTOR COMPONENTS INDUSTRIES, LLC, Phoenix, AZ (US)

(72) Inventors: Michal Olsak, Sokolnice (CZ); Pavel Baros, Zastavka U Brna (CZ)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 17/132,092

(22) Filed: Dec. 23, 2020

Related U.S. Application Data

(60) Provisional application No. 63/057,032, filed on Jul. 27, 2020.

(51) Int. Cl.
    *G05F 1/565* (2006.01)
    *H03K 17/12* (2006.01)
    *H03K 17/042* (2006.01)

(52) U.S. Cl.
    CPC ........... *H03K 17/122* (2013.01); *G05F 1/565* (2013.01); *H03K 17/04206* (2013.01)

(58) Field of Classification Search
    CPC ........... H03K 17/122; H03K 17/04206; H03K 17/14; G01R 31/64; G05F 1/46; G05F 1/565
    See application file for complete search history.

(56) References Cited

U.S. PATENT DOCUMENTS 10,345,838 B1 * 7/2019 Karadi .................... G05F 1/575
2011/0115520 A1   5/2011 Horsky et al.

FOREIGN PATENT DOCUMENTS

EP            3470954 B1     8/2020

* cited by examiner

*Primary Examiner* — Jung Kim
(74) *Attorney, Agent, or Firm* — Ramey & Schwaller, LLP

(57) ABSTRACT

A method of operating a driver circuit includes receiving a data signal at a first input of an amplification circuit; amplifying, using the amplification circuit, the data signal to produce an output signal through an output pin; attenuating, using a feedback network, the output signal to produce a feedback signal; coupling the feedback signal to a second input of the amplification circuit; detecting, using a control circuit, a fault condition; and decoupling, responsive to detecting the fault condition, the feedback signal from the second input of the amplification circuit. In some embodiments, the driver circuit transmits a fault condition signal to an electronic control unit of an automobile.

14 Claims, 6 Drawing Sheets

INSTABILITY MANAGEMENT IN A SIGNAL DRIVER CIRCUIT

CROSS-REFERENCE TO RELATED APPLICATIONS

The present application is related to U.S. Provisional App. 63/057,032, filed Jul. 27, 2020, entitled "Apparatus and Method for Instability Detection in Amplifiers," which is entirely incorporated by reference herein.

BACKGROUND

The output of data signal drivers can be stabilized using one or more stabilization circuits. These stabilization circuits are frequently effective in stabilizing the output of data signal drivers. However, sometimes they fail to perform as desired due to environmental conditions or other causes. While methods for coping with such failure conditions exist, there nevertheless remains room for improvement in the art.

SUMMARY

Accordingly, there are disclosed herein systems and methods for detecting stabilization circuit failure and adjusting data signal driver operations to minimize the effects of stabilization circuit failure on the data signal driver.

One embodiment of this disclosure is a signal driver, comprising: an amplification circuit having a first input operable to receive a feedback signal corresponding to an output signal, a second input operable to receive a data signal, a first output operable to provide the output signal, a second output operable to provide a first current signal, and a third output operable to provide a second current signal; a first detector circuit having a first detector input coupled to the second output of the amplification circuit and a first detector output operable to provide a first detection signal, wherein the first detection signal indicates whether a current (present) magnitude of the first current signal exceeds a first threshold; a second detector circuit having a second detector input coupled to the third output of the amplification circuit and a second detector output operable to provide a second detection signal, wherein the second detection signal indicates whether a current magnitude of the second current signal exceeds a second threshold; and a control circuit having a first input coupled to the first detector output, a second input coupled to the second detector output, and a first output coupled to the second input of the amplification circuit operable to provide the data signal to the amplification circuit, wherein the control circuit is operable to generate a control signal to control one or more operations of the amplification circuit, responsive to at least one of the first detection signal or the second detection signal.

Another embodiment of this disclosure is a method of operating a driver circuit, comprising: receiving a data signal at a data input of an amplification circuit; amplifying, using the amplification circuit, the data signal to produce an output signal through an output pin; attenuating, using a feedback network, the output signal to produce a feedback signal; coupling the feedback signal to a feedback input of the amplification circuit; detecting, using a control circuit, a fault condition of the amplification circuit; and decoupling, responsive to detecting the fault condition, the feedback signal from the feedback input of the amplification circuit, wherein detecting the fault condition comprises detecting at least one of a high side current between a high side transistor and the output pin during a falling edge interval of the output signal or a low side current between a low side transistor and the output pin during a rising edge interval of the output signal.

DETAILED DESCRIPTION

Please note that the drawings and corresponding detailed description are provided for explanatory purposes, not to limit the disclosure. To the contrary, they provide the foundation for understanding all modifications, equivalents, and alternatives falling within the scope of the appended claims.

Figure 1:
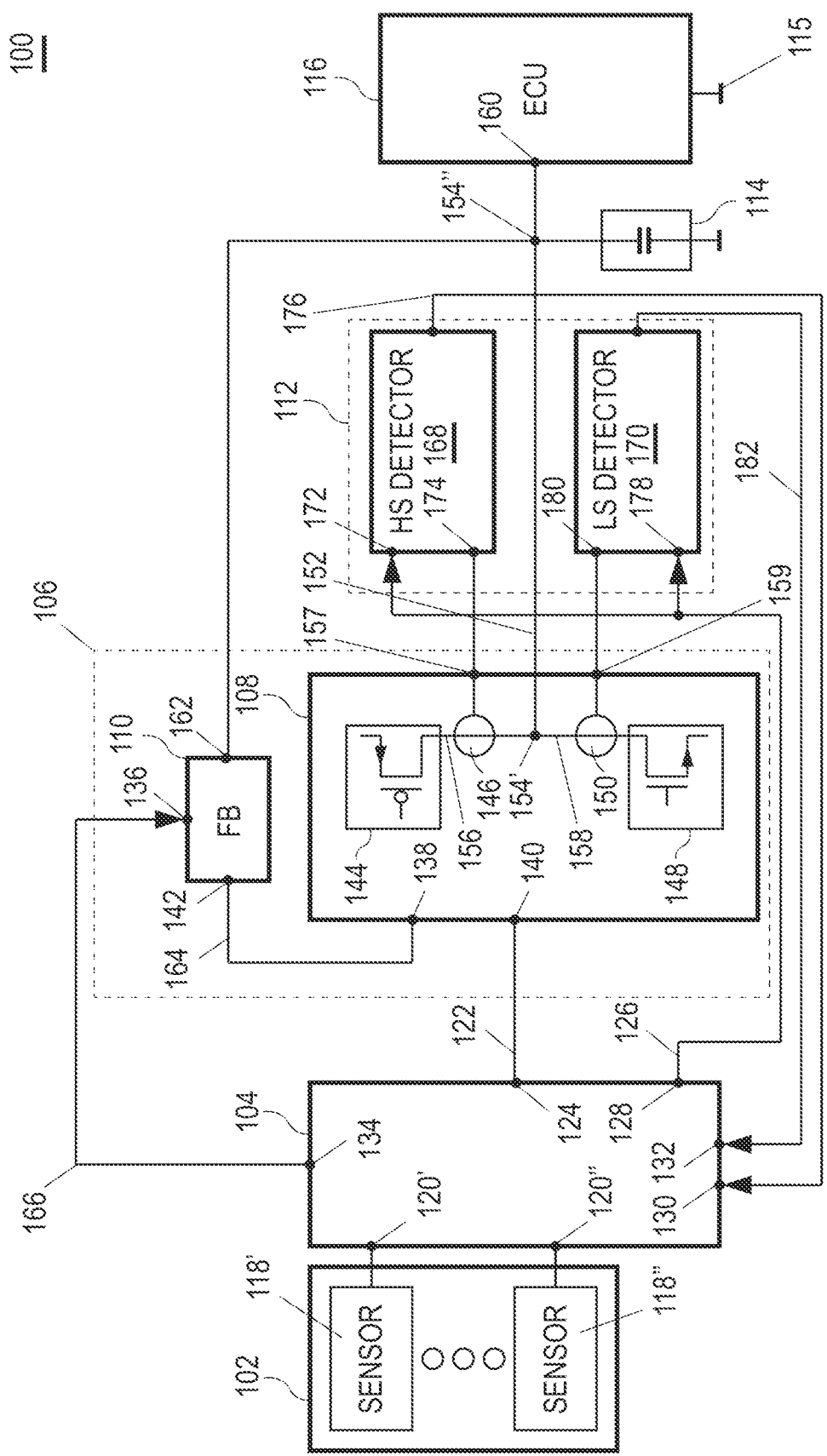
FIG. 1 is a block diagram of an electronic network, in accordance with an example of this disclosure.

FIG. 1 is a block diagram of an electronic network 100, in accordance with an example of this disclosure. The electronic network 100 includes a sensor circuit 102, a control circuit 104, and a driver circuit 106. The driver circuit 106 includes an amplification circuit 108 and a feedback (FB) network 110. In some embodiments, the amplification circuit 108 comprises a class A-B amplifier. The electronic network 100 also includes a detection block 112, a stabilization circuit 114, and an electronic control unit (ECU) 116. In at least one embodiment of this disclosure, the ECU 116 is a microcontroller unit (MCU). In some embodiments, the MCU is an automotive MCU. Both the ECU 116 and the stabilization circuit 114 are connected to signal ground 115.

The sensor circuit 102 includes one or more sensors 118. Output(s) from the one or more sensors 118 is (are) received by the control circuit 104 at one or more sensor inputs 120.

The control circuit 104 outputs a data signal 122 from a data output 124 to the amplification circuit 108. In some examples, the data signal 122 is a pulse width modulated analog signal representing information gathered by the sensor circuit 102. The control circuit 104 outputs an enable signal 126 to the detection block 112 from an enable signal output 128. The control circuit 104 has a high side input 130 and a low side input 132 connected to the detection block 112. The control circuit 104 has a FB control output 134 connected to a FB control input 136 of the FB network 110. As will be explained in greater detail, the control circuit 104 controls whether the FB network 110 provides FB to the amplification circuit 108.

The amplification circuit 108 includes a data signal input 140 connected to the data output 124 of the control circuit 104 through which the amplification circuit 108 receives the data signal 122. The amplification circuit 108 includes a FB input 140 connected to a FB output 142 of the FB network 110. The amplification circuit 108 includes a high side (HS)

transistor 144, a HS current sensor 146, a low side (LS) transistor 148, and a LS current sensor 150. The amplification circuit 108 is configured to amplify the data signal 122 and generate an output signal 152 corresponding to the amplified data signal 122. The output signal 152 is coupled to an output pin 154 of the amplification circuit 108.

The HS transistor 144 can be a p-channel metal-oxide semiconductor (PMOS) transistor comprising a source, a gate, and a drain. The drain of the HS transistor is connected to the output pin 154 through a HS current line 156. The HS current sensor 146 is connected to the detection block 112. The HS current sensor 146 senses current in the HS current 156 line and presents a copy of the HS current to the detection block 112 when active.

The LS transistor can be an n-channel metal-oxide semiconductor (NMOS) transistor comprising a source, a gate, and a drain. The drain of the LS transistor is connected to the output pin 154 through a LS current line. The LS current sensor is connected to the detection block 112. The LS current sensor 150 senses current in the LS current line 158 and presents a copy of the LS current to the detection block 112 when active.

As noted, the amplification circuit 108 outputs the output signal 152 based on the data signal 122 through the output pin 154. The output pin 154 is connected to the FB network 110, the ECU 116, and—under normal conditions—the stabilization circuit 114. The amplification circuit 108 amplifies the data signal 122 to produce the output signal 152. Under normal conditions, the amplification circuit 108 and output signal 152 which it produces are stabilized by the stabilization circuit 114. Under normal conditions, the output signal 152 is received by the ECU 116 at an ECU input 160. The output pin 154 is connected to a FB input 162 of the FB network 110.

As noted, the FB network 110 includes the FB input 162 connected to the output pin 154 of the amplification circuit 108. In some embodiments of this disclosure, the FB network 110 includes a resistive network. In at least one embodiment, the FB network 110 is an attenuator circuit. Under normal conditions, the FB network 110 receives the output signal 152, scales the output signal 152, and outputs a scaled signal 164 to the amplification circuit 108 through the FB output 142. The FB output 142 is connected to the FB input 140 of the amplification circuit 108. The scaled signal 164 is scaled to the scale of the data signal 122. That is, the FB network 110 reduces the amplitude of the output signal 152 to the same extent that the amplification circuit 108 amplifies the data signal 122 so that the amplitude of the scaled signal 164 and the amplitude of the data signal 122 are matched (or very nearly matched). When the scaled signal 164 is provided to the amplification circuit 108, the amplification circuit 108 can be said to be operating in a closed-loop mode. There can be times, however, when it is advantageous for the FB network 110 to not provide the scaled signal 164 to the amplification circuit 108. When the FB network 110 does not provide the scaled signal 164 to the amplification circuit 108, the amplification circuit 108 can be said to be operating in an open-loop mode. The control input 136 of the FB network 110 is connected to the control output 134 of the control circuit 104. The control circuit controls 104 whether the FB network 110 provides the scaled signal 164 to the amplification circuit 108 through a control signal 166. In at least one embodiment, when the control signal 166 is set to logic zero, the FB network 110 provides the scaled signal 164 to the amplification circuit 108. In some embodiments, when the control signal 166 is set to logic one, the FB network does not provide the scaled signal 164 to the amplification circuit 108. Thus, the control circuit 104 controls whether the amplification circuit 108 operates in the closed-loop mode or the open-loop mode.

The detection block 112 includes a HS detector circuit 168 and a LS detector circuit 170. The HS detector circuit 168 includes a HS enable input 172 connected to the enable output 128 of the control circuit 104 and a HS sensor input 174 connected to the HS current sensor 146 of the amplification circuit 108. The HS detector circuit 168 receives a copy of the HS current sensed by the HS current sensor 146 through the HS sensor input 174 when the HS detector circuit 168 is activated in accordance with the enable signal 126 received from the control circuit 104. When the HS detector circuit 168 is active and the HS detector circuit 168 detects a HS current (above a predetermined threshold), the HS detector circuit 168 outputs a HS detection signal 176 to the HS input 130 of the control circuit 104.

The LS detector circuit 170 includes a LS enable input 178 connected to the enable output 128 of the control circuit 104 and a LS sensor input 180 connected to the LS current sensor 150 of the amplification circuit 108. The LS detector circuit 170 receives a copy of the LS current sensed by the LS current sensor 150 through the LS sensor input 180 when the LS detector circuit 170 is activated in accordance with the enable signal 126 received from the control circuit 104. When the LS detector circuit 170 is active and the LS detector circuit 170 detects a LS current (above a predetermined threshold), the LS detector circuit 170 outputs a LS detection signal 182 to the LS input 132 of the control circuit 104.

As noted, the data signal 122 is a pulse width modulated (PWM) analog signal, and the output signal 152 from the amplification circuit 108 is an amplified version of that PWM analog signal. Under normal conditions, (e.g., when the stabilization circuit 114 is well connected), when the voltage of the output signal 152 is rising, the HS detector circuit 168 will detect HS current in the HS current line 156 and will output a HS detection signal 176 accordingly. The HS detector circuit will not—under normal conditions—detect HS current in the HS current line 156 when the voltage of the output signal 152 is falling (or stable).

Similarly, when the stabilization circuit 114 is well connected and the voltage of the output signal 152 is falling, the LS detector circuit 170 will detect LS current in the LS current line 158 and will output a LS detection signal 182 to the control circuit 104. The LS detector circuit will not—under normal conditions—detect LS current in the LS current line 158 when the voltage of the output signal 152 is rising (or stable). When operating properly, the stabilization circuit 114 minimizes or eliminates unwanted oscillations in the amplification circuit 108. When operating properly, the stabilization circuit 114 helps to ensure that output signal 152 is driven only by the HS transistor 144 during the rising edge periods of the output signal 152 and driven only by the LS transistor 148 during the falling edge periods of the output signal 152. During rising edge periods of the output signal 152, current flows out of the amplification circuit 108. In embodiments of this disclosure, current which flows out of the output pin 154 of the amplification circuit 108 is considered negative current. Conversely, current which flows into the amplification circuit 108 through the output pin 154 is considered positive current.

There can be times, however, when the stabilization circuit 114 does not function properly. For example, a capacitor of the stabilization circuit 114 could become partially or fully disconnected. The resistance (reactance) of the stabilization circuit 114 could rise due to environmental conditions. For example, if a capacitor of the stabilization circuit 114 is soldered or glued in place, heat and/or normal wear and tear may cause the stabilization circuit 114 to perform poorly or not at all. As will be explained in greater detail, a partial or complete failure of the stabilization circuit 114 can cause the amplification circuit 108 to oscillate. Such oscillations can be manifested in the detection block's detection of HS current and/or LS current when HS current and/or LS current should not be detected. In at least one embodiment of this disclosure, the control circuit 104 is configured to switch the amplification circuit 108 from operating in a closed-loop mode to operate in an open-loop mode when HS detection signal 176 and/or LS detection signal 182 are received from the detection block 112 at inappropriate times.

Figure 2:
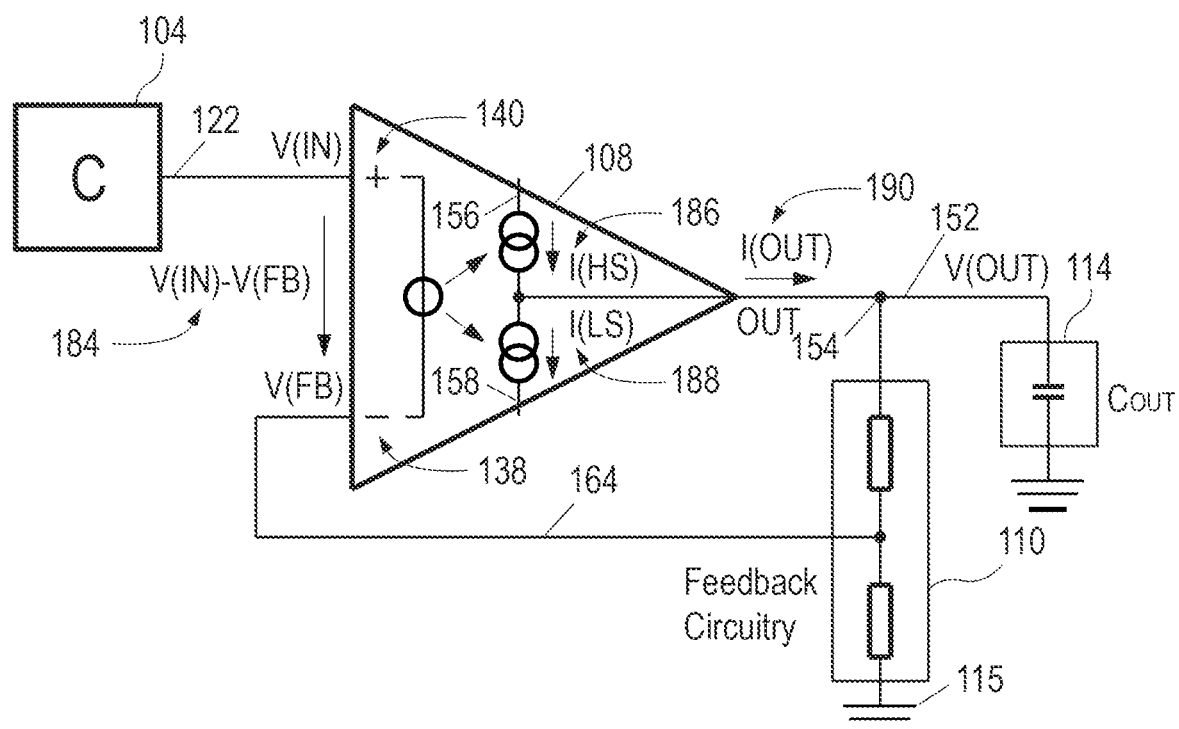
FIG. 2 illustrates aspects of the electronic network of FIG. 1, in accordance with an example of this disclosure.
Figure 3:
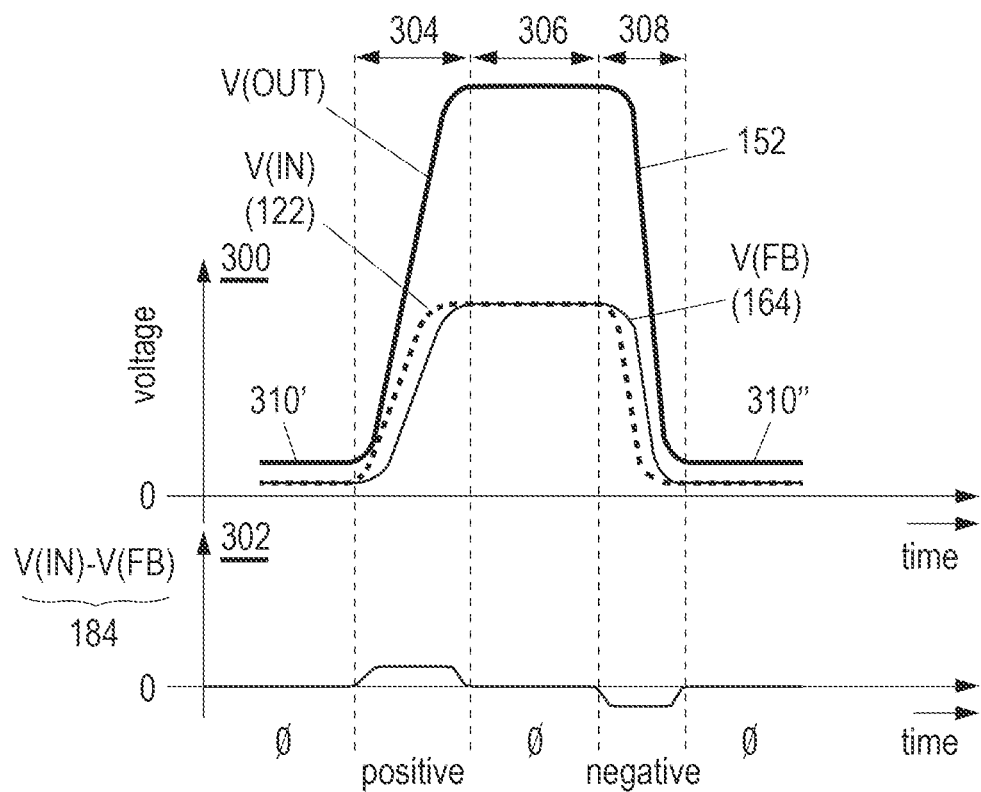
FIG. 3. illustrates the relationships of various signals of the electronic network to an amplified data output signal produced using the electronic network.

FIG. 2 illustrates aspects of the electronic network 100 of FIG. 1, in accordance with an example of this disclosure. FIG. 3 illustrates plots of signals of the electronic network 100. The control circuit 104 provides a V(IN) data signal 122 to the positive input 140 of the amplification circuit 108. The FB network 110 provides the V(FB) scaled signal 164 to the negative (inverting) input 140 of the amplification circuit 108. The V(IN) data signal 122 is amplified by the amplification circuit 108 to produce V(OUT) 152. The difference 184 between the voltage at the negative input 138 and the voltage at the positive input 140 is [V(IN)–V(FB)] 184. The relationship of V(IN) and V(FB) to V(OUT) is shown in the upper plot 300 of FIG. 3. The relationship of [V(IN)–V(FB)] 184 to V(OUT) is shown in the lower plot 302 of FIG. 3. The voltage difference 184 between the positive input 140 and the negative input 138 produces HS current 186 in HS current line 156 and/or LS current 188 in LS current line 158. When current I(OUT) 190 of output signal 152 flows out of amplification circuit 108, current I(OUT) 190 is negative. When current I(OUT) 190 of output signal 152 flows into amplification circuit 108, current I(OUT) 190 is positive.

The signal V(OUT) 152 trails (slightly) the data signal 122 because of physical characteristics of the amplification circuit 108, such as slew-rate and/or bandwidth, as shown in upper plot 300. As discussed, the V(OUT) signal 152 is monitored by the FB network 110 (e.g., resistive divider) and fed back to negative input 138 of the amplification circuit 108. The V(FB) signal 164 is a scaled version of V(OUT) signal 152. V(FB) signal 164 thus trails V(OUT) signal 152, as shown in the upper plot 300 of FIG. 3. As shown in the lower plot 302 of FIG. 3, the difference between the voltage of the data signal 122 and the voltage of the FB signal 164 [V(IN)–V(FB)] can be positive, negative, or zero.

The rising signal edge of V(IN) signal 122 causes the voltage of V(OUT) signal 152 to rise during in interval 304. But, as noted above, the V(OUT) signal 152 trails the V(IN) signal 122. In these periods 304, V(IN) exceeds V(FB), and thus the difference between the voltage of the data signal 122 and the voltage of the V(FB) signal 164 is positive (see interval 304 in lower plot 302). During those periods 304 in which V(OUT) rises, the absolute value of I(HS) current 186 is greater than that of the I(LS) current 188. During the rising edge interval 304, I(OUT) current 190 flows from the amplification circuit 108. That is, I(OUT) current 190 is positive during the rising edge interval 304. The I(OUT) current 190 from the amplification circuit 108 flows into the stabilization circuit 114. Noting that I(OUT) 190=I(HS) 186–I(LS) 188, the negative I(OUT) current charges one or more capacitors of the stabilization circuit 114, causing V(OUT) and V(FB) to rise until V(FB) and V(IN) are equal, [V(FB)=V(IN)] and the amplification circuit 108 achieves a steady state in which V(OUT) is constant, as shown in interval 306. During the rising signal edge periods 304, the HS detector circuit 168 will detect HS current 186 which exceeds a HS threshold. When the HS detector circuit 168 detects the HS current 186 above the threshold, the HS detector circuit emits HS detection signal 176, which is received by the control circuit 104. During the rising signal edge periods 304, the LS detector circuit 170 will not detect LS current 188 whose magnitude does not exceed a LS threshold, so the LS detector circuit 170 will not emit a LS detection signal 182.

When the amplification circuit 108 is in a (high) steady [V(FB)=V(IN)], as shown in interval 306, FB signal 164 from the output pin 154 of the amplification circuit 108 is received at the amplification circuit's input 138 through the FB network 110 (e.g., resistive divider). As indicated, the FB network 110 continues to regulate V(FB) such that it is equal to (VIN); I(HS)=I(LS) and therefore I(OUT) is zero. It will be understood by persons of skill that although current flows into the FB network 110, this current is not included in the equation to simplify the explanation.

During those periods 308 in which the voltage of the data signal 122 falls, the voltage of output signal 152 and FB signal 164 also fall but are delayed. During the falling edge periods 308, V(FB) exceeds V(IN), making V(IN)–V(FB) negative (see interval 308 of plot 302. During the falling edge periods 308, the absolute value of I(HS) current 186 is lower than I(LS) current 188, and therefore I(OUT) current is positive (flowing into the amplification circuit 108 and out of the stabilization circuit 114 until the amplification circuit 108 reaches a (low) steady state 310. Note that I(OUT)=I(HS)–I(LS). The positive I(OUT) current discharges one or more capacitors of stabilization circuit 114, causing V(OUT) and V(FB) to fall until the amplification circuit 108 achieves the (low) steady state 310, in which V(FB)=V(IN) and VIN–VFB=0. During the falling signal edge periods 308, the LS detector circuit 170 will detect LS current 188 when the magnitude of the LS current 188 exceeds a LS threshold (606). When the LS detector 170 detects the LS current 188 above the threshold, the LS detector circuit 170 emits an LS detection signal 182, which is received by the control circuit 104. During the falling signal edge periods 308, the HS detector circuit 168 will not detect HS current 186 above the HS threshold, so the HS detector circuit 168 will not emit a HS detection signal 176.

It will be understood by those of skill that although V(IN)–V(FB) can be positive, negative, or zero, V(OUT)—under normal conditions—does not have a negative value.

Under normal conditions, the control circuit 104 receives HS detection signals during the rising edge periods and receives LS detection signals during the falling edge periods.

If the stabilization circuit 114 partially or wholly fails, such failure may cause the amplification circuit 108 to oscillate. Consequently, HS current 186 above the threshold may be detected by the HS detector circuit 168 during the falling edge periods 308. The HS detector circuit 168 will emit a HS detection signal 176 as a result. Alternately or additionally, if the stabilization circuit 114 partially or wholly fails, LS current 188 (whose magnitude exceeds the LS threshold) may be detected by the LS detector circuit 170 during the rising edge periods 304. The LS detector circuit 170 will emit a LS detection signal 182 as a result.

The control circuit 104 is configured such that when the control circuit 104 receives one or more HS detection signals 176 during a falling edge period 308 and/or one or more LS detection signals 182 during a rising edge period 304, the control circuit 104 determines that the stabilization circuit 114 has failed. When the control circuit 104 determines that the stabilization circuit 114 has failed, the control circuit 104 sends a logic one control signal 166 to the FB network 110, which causes the FB network 110 to stop (at least temporarily) providing the FB signal 164 to the negative input 138 of the amplification circuit 108, causing the amplification circuit 108 to operate in an open-loop mode. In some examples, the control circuit 104 will send a signal to the ECU 116 indicating that the stabilization circuit 114 has failed. In some examples, although the stabilization circuit 114 has failed (and is no longer stabilizing amplification circuit 108) the amplification circuit 108 will continue to send information (signals 152) to the ECU 116. In some examples, control circuit 104 will not determine that the stabilization circuit 114 has failed unless a minimum number of inappropriate HS detection signals 176 and/or LS detection signals 182 are received in a predetermined interval.

Figure 4:
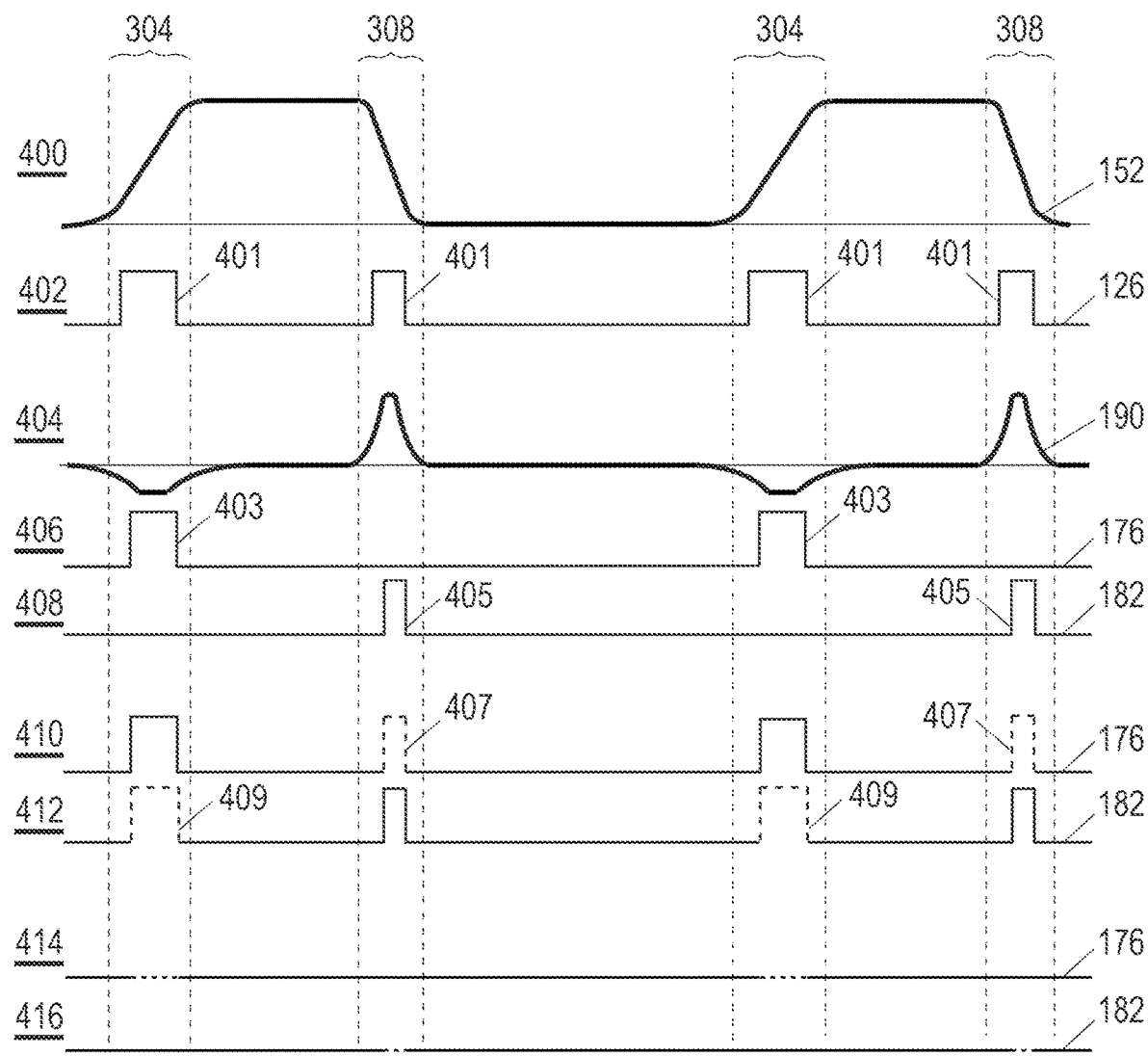
FIG. 4 illustrates plots of various signals of this disclosure and their relationship to the output signal.

FIG. 4 illustrates plots of various signals of this disclosure and their relationship to output signal 152. Plot 400 shows a plot of output signal 152. Plot 402 shows a plot of enable signal 126.

As discussed, the control circuit 104 emits a logic one enable signal 401 during the rising edge intervals 304 of the output signal 152 and the falling edge intervals 308 of the output signal 152.

Plot 404 shows a plot of output current 190 at the stabilization circuit 114. During normal operations, when the amplification circuit 108 is operating in a closed-loop mode, output current 190 flows into the stabilization circuit 114 from the HS transistor 144 during the rising edge intervals 304, and output current 190 flows out of the stabilization circuit 114 into the LS transistor 148 during falling edge intervals 308.

Plot 406 shows a plot of a HS detection signal 176 in the HS detector circuit 168 and plot 408 shows a plot of a LS detection signal 182 in the LS detector circuit 170. Plot 406 and plot 408 collectively illustrate the situation in which the stabilization circuit 114 is operating within normal parameters. Because the stabilization circuit 114 is stabilizing the amplification circuit 108, the HS detector circuit 168 detects HS current 186 only during rising edge intervals 304, and so emits a logic one (HS detection) signal 403 only during the rising edge intervals 304. Likewise, because the stabilization circuit 114 is stabilizing the amplification circuit 108 (along with output signal 152), the LS detector circuit 170 detects LS current 188 only during falling edge intervals 308, and so emits a logic one (LS detection) signal 405 only during the falling edge intervals 308.

Plot 410 shows a plot of a HS detection signal 176 in the HS detector circuit 168 and plot 412 shows a plot of a LS detection signal 182 in the LS detector circuit 170. In plot 410, the HS detector circuit 168 detects HS current 186 during falling edge intervals 308, and so emits a logic one (HS detection) signal 407 during the falling edge intervals 308. In plot 412, the LS detector circuit 170 detects LS current 188 during rising edge intervals 304, and so emits a logic one (LS detection) signal 409 during the falling edge intervals 308. Plot 410 and plot 412 thus correspond to a situation in which the stabilization circuit 114 is partially or wholly failing (and the amplification circuit 108 is oscillating due to the failure).

Plot 414 shows a plot of a HS detection signal 176 in the HS detector circuit 168 and plot 416 shows a plot of a LS detection signal 182 in the LS detector circuit 170. Plot 414 and plot 416 illustrates detection patterns of the HS detector circuit 168 and LS detector circuit 170 which correspond to a failure condition in the stabilization circuit 114 which is different from the failure condition shown in plot 410 and plot 412. In this alternate failure condition, the HS detector circuit 168 does not detect HS current 186 during one or more rising edges 304 of the output signal 152 and/or the LS detector circuit 170 does not detect LS current 188 during one or more falling edge intervals 308 of the output signal 152. As in the failure condition illustrated in plot 410 and 412, the control circuit 104 can determine that the stabilization circuit 114 has failed. As a result, the control circuit 104 will send a control signal 166 to the FB network 110, which causes the FB network 110 to stop (at least temporarily) providing the FB signal 164 to the negative input 138 of the amplification circuit 108, causing the amplification circuit 108 to operate in the open-loop mode. In some examples, the control circuit 104 will send a signal to the ECU 116 indicating that the stabilization circuit 114 has failed. In some examples, although the stabilization circuit 114 has failed (and is no longer stabilizing amplification circuit 108) the amplification circuit 108 will continue to send output signals 152 to the ECU 116. In some examples, control circuit 104 will not determine that the failure condition corresponding to plot 414 and plot 416 unless the control circuit 104 fails to receive a HS detection signal 176 during one or more rising edge intervals 304 and/or fails to receive a LS detection signal 182 during one or more falling edge intervals 308 during predetermined length of time.

In at least one example, the control circuit 104 will return the amplification circuit 108 to the closed-loop mode after causing the amplification circuit 108 to operate in the open-loop mode for a predetermined length of time. If, after returning the amplification circuit 108 to closed-loop mode, another failure of the stabilization circuit 114 occurs, the control circuit 104 may return the amplification circuit 108 to the open-loop operating mode.

Figure 5A:
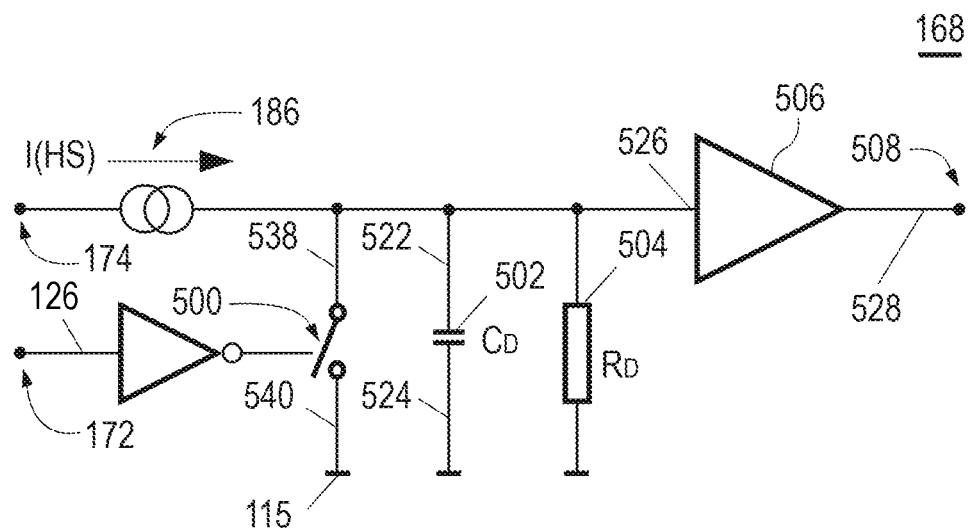
FIG. 5A illustrates details of a high side current detector circuit of this disclosure.

FIG. 5A illustrates details of a HS detector circuit 168. The HS detector circuit 168 includes HS detection input 174 and enable input 172. The enable input 172 includes an inverter. The HS detector circuit 168 also includes a switch 500, a capacitor 502, a resistor 504 and a comparator 506. The comparator 506 is connected to the control circuit 104 through detection pin 508. In at least one example, the switch 500, the capacitor 502, and the resistor 504 are connected to signal ground 115. When the enable signal is zero (e.g., the controller 104 is not sending an enable signal 126 to the HS detector circuit 168), the enable input 172 closes the switch 500. That is, the HS detector circuit 168 is shorted by the switch 500 when the enable signal 126 is logic zero. When the HS detector circuit 168 is shorted by the switch 500, any charge stored by the capacitor 502 will be discharged (the capacitor 502 will be in a discharged state when the electronic network 100 is powered on). When the HS detector circuit 168 is shorted by the switch 500, the detector circuit 168 is disabled and any current received through the input 174 will be sent to signal ground 115. However, under normal conditions, the controller 104 sends an enable signal 126 (e.g., logic one) only during the rising edge intervals 304 and the falling edge intervals 308 of the output signal 152. Unless amplification circuit 108 oscillates, the detector circuit 168 will detect HS current 156 only during the rising edge periods 304 when activated by enable signal 126.

Figure 5B:
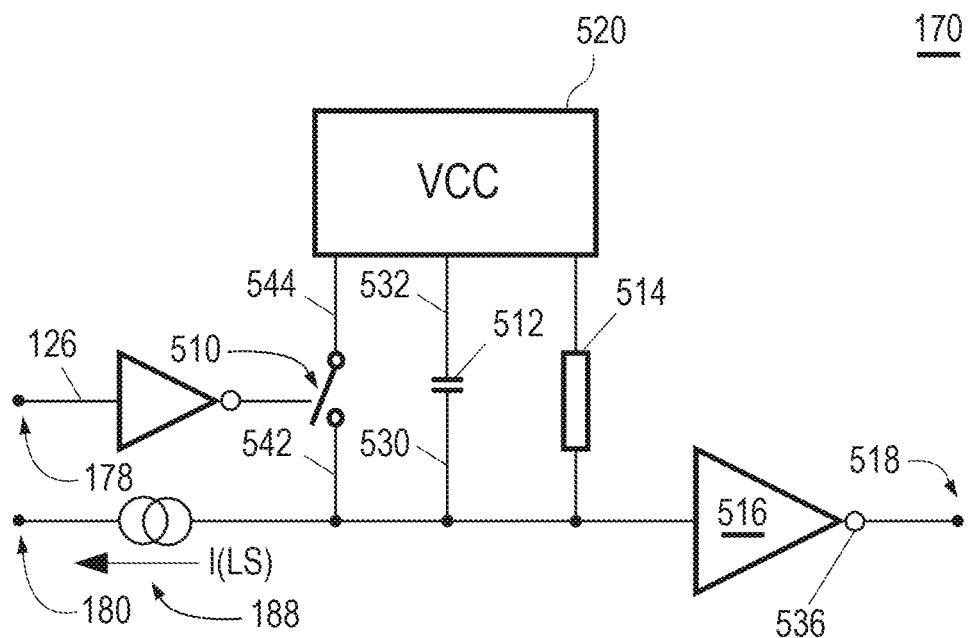
FIG. 5B illustrates details of a low side current detector circuit of this disclosure.

FIG. 5B illustrates details of a LS detector circuit 170. The LS detector circuit 170 includes LS detection input 180 and enable input 178. The enable input 178 includes an inverter. The LS detector circuit 170 also includes a switch 510, a capacitor 512, a resistor 514 and a comparator 516. The comparator 516 is connected to the control circuit 104 through detection pin 518. In at least one example, the switch 510, the capacitor 512, and the resistor 514 are connected to a supply voltage 520. When the enable signal 126 is logic zero, the enable input 178 closes the switch 510. That is, the LS detector circuit 170 is shorted by the switch 510 when the enable signal 126 is logic zero. When the LS detector circuit 170 is shorted by the switch 510, any charge stored by the capacitor 512 will be discharged (the capacitor 512 will be in a discharged state when the electronic network 100 is initially powered on). When the LS detector circuit 170 is shorted by the switch 510, the LS detector circuit 170 is disabled and any current received through the input 180 will be sent to supply voltage 520.

However, under normal conditions, the controller 104 sends an enable signal 126 (logic one) only during the rising edge intervals 304 and the falling edge intervals 308 of the output signal 152. Unless amplification circuit 108 oscillates, the LS detector circuit 170 will detect LS current 188 only during the falling edge periods 308 when activated by enable signal 126.

Figure 6:
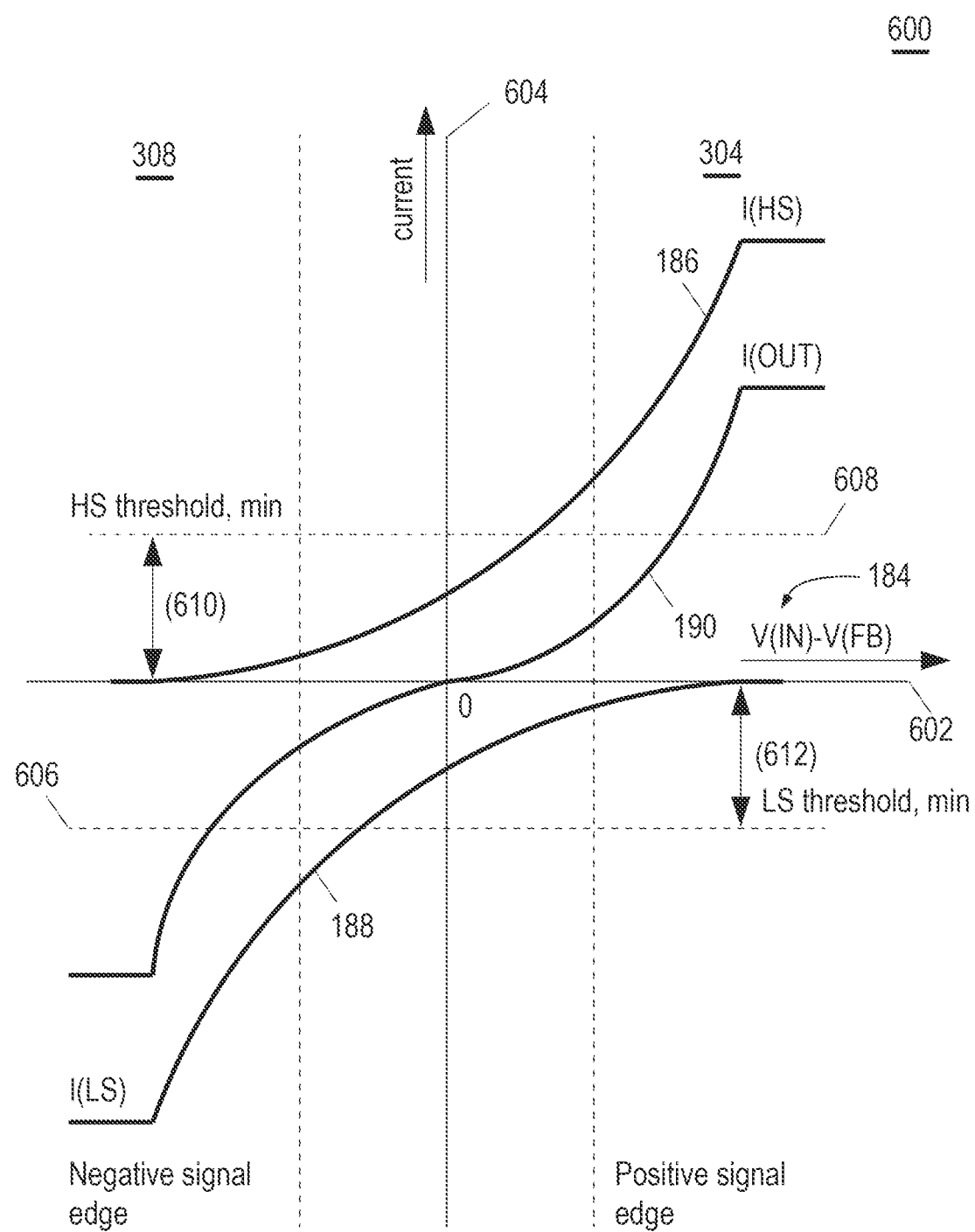
FIG. 6 illustrates a characteristic curve of an amplification circuit.

FIG. 6 illustrates a characteristic curve (I-V curve) 600 of the amplification circuit 108, in which the horizontal axis 602 corresponds to the difference between the voltage of the data signal 122 and the voltage of the FB signal 164 and the vertical axis 604 corresponds to current at output pin 154. FIG. 6 illustrates the relationship between HS current 186, LS current 188, and output current 190 (corresponding to output signal 152) on the one hand, and the difference 184 between the voltage (V(IN) of data signal 122 and the voltage (V(FB)) of FB signal 164. (FIG. 3 and FIG. 4 illustrate how the voltage (V(OUT) of output signal 152 changes during operation of network 100). Under normal conditions, during falling edge periods 308 of output signal 152, the LS detector circuit 170 detects LS current 188 having a magnitude greater than LS current threshold 606. Similarly, under normal conditions, during rising edge periods 304, the HS detector circuit 168 will detect HS current 186 having a magnitude greater than HS current threshold 608. However, if the HS detector circuit 168 detects HS current 186 with a magnitude greater than HS threshold 608 during a falling edge interval 308 (indicating that the amplification circuit 108 is oscillating), the HS detector circuit 168 will output a HS detection signal 176 to the control circuit 104. If the LS detector circuit 170 detects LS current 188 with a magnitude that is greater than the LS current threshold 606 during a rising edge interval 304 (indicating that the amplification circuit 108 is oscillating), the LS detector circuit 170 will send a LS detection signal 182 to the control circuit 104. In one or more embodiments, if the control circuit 104 receives a HS detection signal 176 during a falling edge interval 308 and/or receives a LS detection signal 182 during a rising edge interval 304, the control circuit 104 will send a control signal 166 to the FB network 110 to cause the amplification circuit 108 to switch to an open-loop operating mode in which the amplification circuit 108 will not receive the FB signal 164 at negative input 138.

Figure 7:
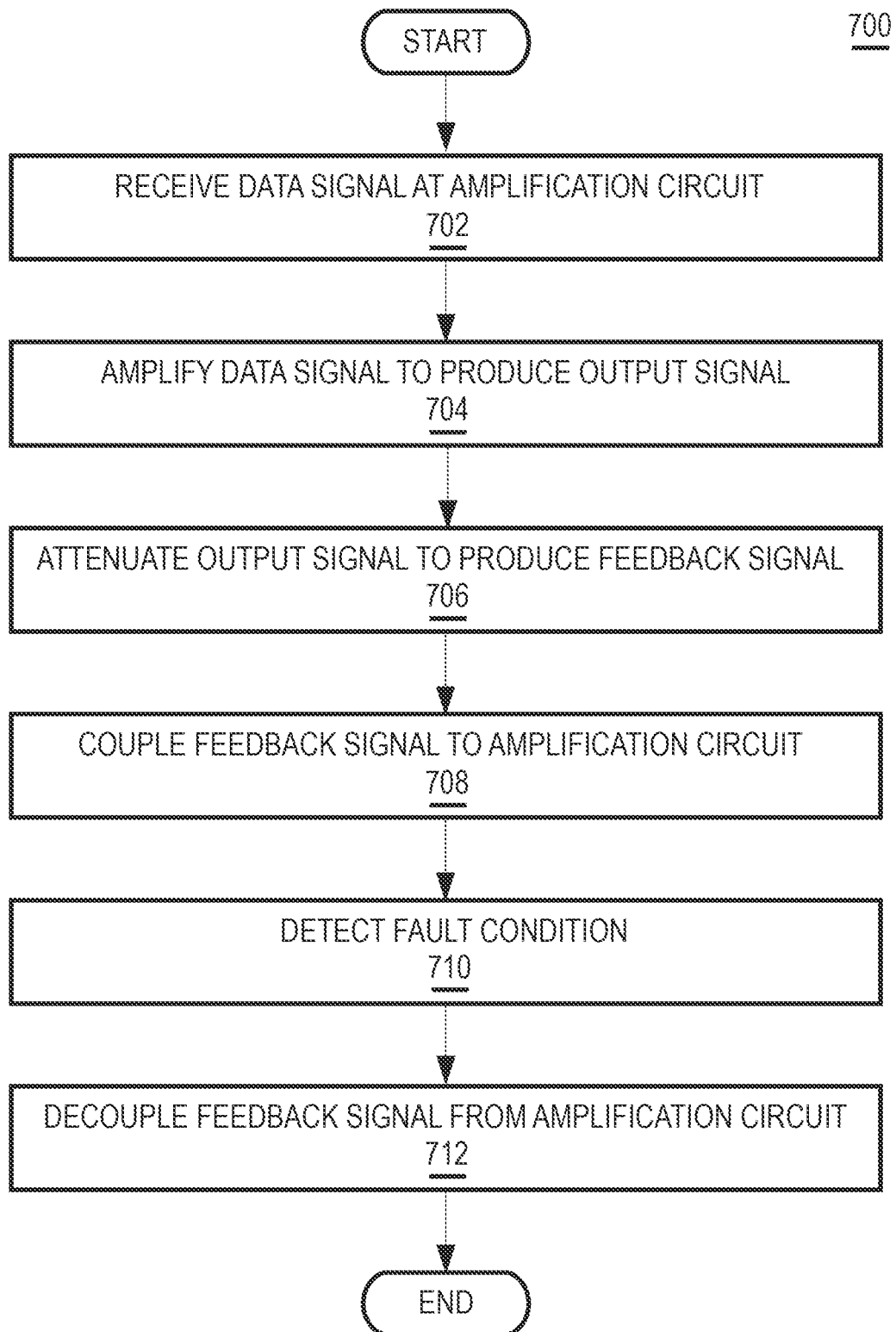
FIG. 7 illustrates a method of operating a driver circuit, in accordance with an example of this disclosure.

FIG. 7 illustrates a method 700 of operating a driver circuit, in accordance with an example of this disclosure. The method comprises receiving 702 a data signal (122) at a data input (140) of an amplification circuit (108); amplifying 704, using the amplification circuit (108), the data signal (122) to produce an output signal (152) through an output pin (154); attenuating 706, using a feedback network (110), the output signal (152) to produce a feedback signal (164); coupling 708 the feedback signal (164) to a feedback input (138) of the amplification circuit (108); detecting 710, using a control circuit (104), a fault condition of the amplification circuit (108); and decoupling 712, responsive to detecting the fault condition, the feedback signal (164) from the feedback input (138) of the amplification circuit (108).

In at least one example of the method 700, detecting the fault condition comprises detecting at least one of a high side current between a high side transistor and the output pin during a falling edge interval (308) of the output signal (152) or a low side current between a low side transistor and the output pin during a rising edge interval (304) of the output signal (152).

Embodiments of this disclosure include the following examples:

1. A signal driver, comprising: an amplification circuit (108) having a first input (138) operable to receive a FB signal (164) corresponding to an output signal (152), a second input (140) operable to receive a data signal (122), a first output (154) operable to provide the output signal (152), a second output (157) operable to provide a first current signal (186), and a third output (159) operable to provide a second current signal (188); a first detector circuit (168) having a first detector input (174) coupled to the second output (157) of the amplification circuit (108) and a first detector output (508) operable to provide a first detection signal (176), wherein the first detection signal (176) indicates whether a current magnitude of the first current signal (186) exceeds a first threshold (608); a second detector circuit (170) having a second detector input (180) coupled to the third output (159) of the amplification circuit (108) and a second detector output (518) operable to provide a second detection signal (182), wherein the second detection signal (182) indicates whether a current magnitude of the second current signal (188) exceeds a second threshold (606); and a control circuit (104) having a first input (130) coupled to the first detector output (508), a second input (132) coupled to the second detector output (518), and a first output (124) coupled to the second input (140) of the amplification circuit (108) operable to provide the data signal (122) to the amplification circuit (108), wherein the control circuit (104) is operable to generate a control signal to control one or more operations of the amplification circuit (104), responsive to at least one of the first detection signal (176) or the second detection signal (182)

2. The signal driver of embodiment 1, wherein the first detection signal (176) further indicates whether the first current signal (186) is within a first operating range (610), and wherein the second detection signal (182) further indicates whether the second current signal (188) is within a second operating range (612).

3. The signal driver of embodiment 1, wherein the first detector circuit (168) comprises: a capacitor (502) having a first terminal (522) and a second terminal (524), wherein the capacitor (502) is charged by the first current signal (186); and a comparator (506) having a comparator input (526) coupled to the first terminal (522) of the capacitor (502) and a comparator output (528) coupled to the first detector output (508) operable to provide the first detection signal (176).

4. The signal driver of embodiment 3, wherein the first detector circuit (168) further comprises: a switch (500) having a first terminal (538) coupled to the first terminal (522) of the capacitor (502), a second terminal (540) coupled to the second terminal (524) of the capacitor (502), and a control input (172) operable to receive a detector activation signal (126); and wherein the control circuit (104) has a second output (128) coupled to the control input (172)

operable to provide the detector activation signal (126) to the first detector circuit (168).

5. The signal driver of embodiment 3, wherein the comparator is a Schmitt trigger.

6. The signal driver of embodiment 1, wherein the second detector circuit (170) comprises: a capacitor (512) having a first terminal (530) and a second terminal (532), wherein the capacitor (512) is charged by the second current signal (188); and a comparator (516) having a comparator input (534) coupled to the first terminal (530) of the capacitor (512) and an output (536) coupled to the second detector output (518) operable to provide the second detection signal (182)

7. The signal driver of embodiment 6, wherein the second detector circuit (170) further comprises: a switch (510) having a first terminal (542) coupled to the first terminal (530) of the capacitor (512), a second terminal (544) coupled to the second terminal (532) of the capacitor (512), and a control input (178) operable to receive a detector activation signal (126); and wherein the control circuit (104) has a second output (128) coupled to the control input (178) operable to provide the detector activation signal (126) to the first detector circuit (168).

8. The signal driver of embodiment 6, wherein the comparator (516) comprises an analog-to-digital converter.

9. The signal driver of embodiment 1, further comprising a PMOS transistor (144) configured to produce the first current signal (186).

10. The signal driver of embodiment 1, further comprising a NMOS transistor (148) configured to produce the second current signal (188).

11. The signal driver of embodiment 1, wherein the amplification circuit (108) comprises a class AB amplifier.

12. The signal driver of embodiment 1, further comprising: a feedback network (110) having a first input (162) coupled to the output signal (152) of the amplification circuit (108), a second input operable to receive the control signal (166), and an output (142) coupled to the first input (138) of the amplification circuit (108), wherein the feedback network (110) is configured to decouple the output signal (152) from the first input (138) of the amplification circuit (108) in response to receiving the control signal (166); and wherein the control circuit (104) has a control output (134) coupled to the second input (136) of the feedback network (110) operable to provide the control signal (166) to the feedback network (110), responsive to detecting a fault condition.

13. The signal driver of embodiment 12, wherein the fault condition corresponds to oscillations in the amplification circuit (108).

14. The signal driver of embodiment 12, wherein the fault condition corresponds to detection of current by the first detector circuit during one or more falling edge intervals of the output signal (152).

15. The signal driver of embodiment 12, wherein the fault condition corresponds to detection of current by the second detector circuit during one or more rising edge intervals of the output signal (152).

16. The signal driver of embodiment 12, wherein the control circuit (104) is further configured to transmit a fault condition signal to an electronic control unit in response to receiving at least one of the first detection signal (176) or the second detection signal indicating the fault condition.

17. The signal driver of embodiment 12, wherein the output signal (152) of the amplification circuit (108) is connected to a stabilization circuit, wherein the stabilization circuit is charged by current of the output signal (152) during one or more rising edge intervals of the output signal (152) when the output signal (152) is coupled to the first input (138) of the amplification circuit (108) by the feedback network (110).

18. The signal driver of embodiment 17, wherein the stabilization circuit is operable to discharge current to the amplification circuit (108) during one or more falling edge intervals of the output signal (152) when the output signal (152) is coupled to the first input (138) of the amplification circuit (108) by the feedback network (110).

19. The signal driver of embodiment 17, wherein the fault condition corresponds to an increased resistance of the stabilization circuit.

20. The signal driver of embodiment 17, wherein the stabilization circuit includes a capacitive network comprising one or more capacitors.

21. The signal driver of embodiment 20, wherein the fault condition corresponds to an increased resistance in at least one of the one or more capacitors.

22. A method of operating a driver circuit, comprising: receiving a data signal (122) at a data input (140) of an amplification circuit (108); amplifying, using the amplification circuit (108), the data signal (122) to produce an output signal (152) through an output pin (154); attenuating, using a feedback network (110), the output signal (152) to produce a feedback signal (164); coupling the feedback signal (164) to a feedback input (138) of the amplification circuit (108); detecting, using a control circuit (104), a fault condition of the amplification circuit (108); and decoupling, responsive to detecting the fault condition, the feedback signal (164) from the feedback input (138) of the amplification circuit (108), wherein detecting the fault condition comprises detecting at least one of a high side current between a high side transistor and the output pin during a falling edge interval (308) of the output signal (152) or a low side current between a low side transistor and the output pin during a rising edge interval (304) of the output signal (152).

23. The method of embodiment 22, wherein detecting the fault condition further comprises detecting one or more oscillations in the amplification circuit (108).

24. The method of embodiment 22, further comprising: transmitting, using the control circuit (104), a default condition signal to an electronic control unit (116), responsive to detecting the fault condition.

The embodiments described are illustrative and non-limiting.

What is claimed is:

1. A signal transmittal system, comprising:
an amplification circuit having a first input operable to receive a feedback signal corresponding to an output signal, a second input operable to receive a data signal, a first output operable to provide the output signal, and a second output operable to provide a current signal;
a detector circuit having a detector input coupled to the second output of the amplification circuit and a detector output operable to provide a detection signal, wherein the detection signal indicates that a present magnitude of the current signal exceeds a threshold;
a control circuit having a first input coupled to the detector output, and a first output coupled to the second input of the amplification circuit operable to provide the data signal to the amplification circuit; and
a feedback circuit having a first input coupled to the output signal of the amplification circuit, a second input operable to receive a control signal, and an output coupled to the first input of the amplification circuit, wherein the feedback circuit is configured to decouple the output signal from the first input of the amplification circuit in response to receiving the control signal,
wherein the control circuit is operable to provide the control signal to the feedback circuit, responsive to detecting a fault condition in the amplification circuit.

2. The signal transmittal system of claim 1, wherein the fault condition corresponds to receipt of the detection signal from the detector circuit during one or more falling edge intervals of the output signal.

3. The signal transmittal system of claim 2, wherein receipt of the detection signal from the detector circuit during one or more falling edge intervals of the output signal corresponds to oscillations in the amplification circuit.

4. The signal transmittal system of claim 1,
wherein the amplification circuit includes a third output operable to provide a second current signal,
wherein the signal transmittal system further includes a second detector circuit having a second detector input coupled to the third output of the amplification circuit and a second detector output operable to provide a second detection signal to the control circuit, and
wherein the second detection signal indicates whether a present magnitude of the second current signal exceeds a second threshold.

5. The signal transmittal system of claim 4, wherein the detection signal further indicates whether the current signal is within a first operating range, and wherein the second detection signal further indicates whether the second current signal is within a second operating range.

6. The signal transmittal system of claim 1, wherein the detector circuit comprises:
a capacitor having a first terminal and a second terminal, wherein the capacitor is charged by the current signal; and
a comparator having a comparator input coupled to the first terminal of the capacitor and a comparator output coupled to the detector output operable to provide the detection signal.

7. The signal transmittal system of claim 6, wherein the detector circuit further comprises:
a switch having a first terminal coupled to the first terminal of the capacitor, a second terminal coupled to the second terminal of the capacitor, and a control input operable to receive a detector activation signal, and
wherein the control circuit has a second output coupled to the control input operable to provide the detector activation signal to the detector circuit.

8. The signal transmittal system of claim 4, further comprising a PMOS transistor configured to produce the current signal and an NMOS transistor configured to produce the second current signal.

9. The signal transmittal system of claim 4, further comprising:
a feedback network having a first input coupled to the output signal of the amplification circuit, a second input operable to receive the control signal, and an output coupled to the first input of the amplification circuit, wherein the feedback network is configured to decouple the output signal from the first input of the amplification circuit in response to receiving the control signal; and
wherein the control circuit has a control output coupled to the second input of the feedback network operable to provide the control signal to the feedback network, responsive to detecting a fault condition.

10. The signal transmittal system of claim 9, wherein the fault condition corresponds to oscillations in the amplification circuit.

11. The signal transmittal system of claim 9, wherein the fault condition corresponds to detection, by the detector circuit during one or more falling edge intervals of the output signal, that the present magnitude of the current signal exceeds the first threshold.

12. The signal transmittal system of claim 9, wherein the fault condition corresponds to detection, by the second detector circuit during one or more rising edge intervals of the output signal, that the present magnitude of the second current signal exceeds the second threshold.

13. The signal transmittal system of claim 9, wherein the output signal of the amplification circuit is connected to a stabilization circuit, wherein the stabilization circuit is charged by current of the output signal during one or more rising edge intervals of the output signal when the output signal is coupled to the first input of the amplification circuit by the feedback network.

14. The signal transmittal system of claim 13, wherein the fault condition corresponds to an increased resistance of the stabilization circuit.

* * * * *